(12) United States Patent
Metzgen et al.

(10) Patent No.: US 7,002,370 B1
(45) Date of Patent: Feb. 21, 2006

(54) MULTIPLEXER CONFIGURATION FOR PROGRAMMABLE LOGIC DEVICE

(75) Inventors: Paul Metzgen, London (GB); Dominic Nancekievill, High Wycombe (GB)

(73) Assignee: Altera Corporation, San Jose, CA (US)

( * ) Notice: Subject to any disclaimer, the term of this patent is extended or adjusted under 35 U.S.C. 154(b) by 5 days.

(21) Appl. No.: 10/728,645

(22) Filed: Dec. 4, 2003

(51) Int. Cl.
*H03K 19/177* (2006.01)

(52) U.S. Cl. .............................. 326/41; 326/39; 326/38

(58) Field of Classification Search ............. 326/38–41
See application file for complete search history.

(56) References Cited

U.S. PATENT DOCUMENTS

| | | | | |
|---|---|---|---|---|
| 5,442,306 A | * | 8/1995 | Woo | ............................ 326/39 |
| 5,811,985 A | * | 9/1998 | Trimberger et al. | ........... 326/38 |
| 5,978,260 A | * | 11/1999 | Trimberger et al. | ......... 365/182 |
| 6,097,212 A | * | 8/2000 | Agrawal et al. | ............... 326/41 |

* cited by examiner

*Primary Examiner*—Vibol Tan
(74) *Attorney, Agent, or Firm*—Fish & Neave IP Group of Ropes & Gray LLP; Jeffrey H. Ingerman

(57) ABSTRACT

A multiplexer is configured on a programmable logic device using a plurality of four-input look-up tables chained together. The required number of look-up tables is about one-half the number of inputs of the multiplexer. For an even number of inputs, the number of look-up tables preferably is exactly one-half the number of inputs, while for an odd number of inputs, the number of look-up tables preferably is one-half the number of inputs, plus one-half. The number of control inputs preferably is one more than the number of look-up tables. Preferably, for any one input being a given logic state, and further selected by the one extra input (beyond the number of look-up tables), any particular output may be asserted.

47 Claims, 7 Drawing Sheets

MULTIPLEXER CONFIGURATION FOR PROGRAMMABLE LOGIC DEVICE

BACKGROUND OF THE INVENTION

This invention relates to a multiplexer configuration for a programmable logic device, and more particularly to a multiplexer configuration that consumes fewer logic resources for a given multiplexer function.

A multiplexer may be described as a hardware component that has N data inputs, C control inputs and only one data output. The data on the single output are the data on one of the N data inputs as determined by the state of the C control inputs. Every input can be output through a unique encoding of the C control inputs.

It is common in programmable logic devices to provide logic elements which are based on look-up tables. For example, programmable logic devices available from Altera Corporation, of San Jose, Calif., may include logic elements built around four-input look-up tables. The logic elements can be programmed and programmably interconnected to simulate any logic function, including that of a multiplexer.

One known configuration for implementing a multiplexer in programmable logic is to use two four-input look-up tables to create a four-to-one multiplexer (i.e., a multiplexer where N=4), or one four-input look-up table to create a two-to-one multiplexer. A tree of four-to-one multiplexers and/or two-to-one multiplexers can be used to create a multiplexer having any number of inputs, N, with up to N control inputs.

The control inputs can be encoded according to a binary scheme, requiring, for N data inputs, C control inputs where $C=\log_2 N$ or $C=(INT(\log_2 N)+1)$, depending on whether or not N is an integer power of 2, where $INT(x)$ is a function that returns the largest integer in x (i.e., x rounded down to the nearest integer unless x is already an integer). Thus, for four inputs only two control inputs are required.

Larger multiplexers are created by creating trees of four-to-one binary-encoded multiplexers, each of which consumes two four-input look-up tables. Such a tree consumes at least 0.625N look-up tables for small N, and as N gets larger the most efficient trees approach 2N/3 look-up tables. And if N is such that one or more look-up table inputs are not used, the number of look-up tables required may be an even larger multiple of N, although it also may be possible to replace some of the four-to-one multiplexers with two-to-one multiplexers, each of which consumes only one look-up table, so the number of look-up tables may not increase as much.

The control inputs of a multiplexer also can be encoded using a scheme known as "one-hot" encoding, in which the number of control inputs equals the number of data inputs and only one control input is hot at any one time to select one of the data inputs as the output. It should be noted that although this scheme is referred to as "one-hot," it may not be case that the signal voltage is high on only one control input. Rather, because signals are easily inverted, and may be inverted for various reasons, as long as the values loaded in the look-up table are adjusted accordingly, one or more inputs may have a high signal voltage without being considered "hot." Thus, "one-hot" does not mean that only one input has a high signal voltage, or even that a high logic state is represented by a high signal voltage, or by the same signal voltage for all inputs. Rather, some signals that are high and some signals that are low may be considered to be in the same logic state, and "one-hot" means that only one input can be in the logic state that is considered high.

One method for constructing, from four-input look-up tables, an N-input multiplexer to be encoded using one-hot encoding requires a row of N/2 look-up tables. Each look-up table takes two data inputs and two control lines which are associated with those two data inputs. The look up table calculates a logic function equivalent to logically ANDing each data input with its associated control input and ORing the results of the two ANDs. The results of these N/2 look-up tables are ORed together to make the final multiplexer result. This requires a tree of four-input look-up tables, the number of which tends towards N/6. N/2+N/6=2N/3, so the efficiency is the same as the binary encoding case.

It would be desirable to be able to provide multiplexers in programmable logic that consume fewer of the programmable logic resources.

SUMMARY OF THE INVENTION

The present invention achieves the result of providing multiplexers in programmable logic that consume fewer of the programmable logic resources—i.e., fewer than about 0.57N four-input look-up tables for an N-to-one multiplexer where $N \geq 6$. Indeed, according to the invention, an N-to-one multiplexer can be created from as few as 0.5N four-input look-up tables. If N is odd the number of required look-up tables L increases to $L=0.5(N+1)$, but as N gets large, this becomes only insignificantly greater than 0.5N, and even for N=7, $L=4 \approx 0.57N$ which is no worse than the best case for the previously known arrangement.

In known programmable logic, four-to-one multiplexers (N=4) are created by chaining together two four-input look-up tables in the manner described in more detail below. For N>4, using binary encoding, trees of four-to-one and/or two-to-one multiplexers are created. The most efficient case for a fully-populated one-level tree (i.e., four four-to-one multiplexers feeding a single four-to-one multiplexer) involves five multiplexers, or ten look-up tables, to implement a sixteen-to-one multiplexer. This works out to L=0.625N. The situation may be somewhat better where the tree is not fully populated. Thus, for N=5, one four-to-one multiplexer and one two-to-one multiplexer, or three look-up tables, are required. This works out to L=0.6N. Even for N=6 or N=7, two four-to-one multiplexers (four four-input look-up tables) can be used. This works out to $L \approx 0.67N$ for N=6 or $L \approx 0.57N$ for N=7. For N=8, two four-to-one multiplexers and one two-to-one multiplexer, or five four-input look-up tables, can be used. This works out to L=0.625N, as in the case of N=16. Similar numbers obtain for $9 \leq N \leq 15$.

In accordance with the present invention, the chaining of look-up tables does not stop at two look-up tables as in the previously known arrangement. Rather, one chains together as many look-up tables as one needs, in the manner described below, to create a multiplexer having as many inputs N as are needed. In the arrangement illustrated below, each four-input look-up table can accept two data inputs and thus for even N, L=0.5N. For odd N, L=0.5N+0.5. The odd N and even N cases can be generalized and expressed mathematically as $L=0.5(N+MOD(N,2))$, where $MOD(x,y)$ is a function that returns the integer remainder of the quotient of two integers x/y. It will be seen that MOD(N,2) is equal to zero for even N and is equal to 1 for odd N.

Most preferably, the look-up tables used to implement the multiplexers in accordance with the present invention are located adjacent one another and are chained together by direct "fast" connections in a manner described below. Such an arrangement provides, first, the area savings described above, and, second, faster multiplexers. However, it is not necessary in accordance with the invention to use the direct connections, and the look-up tables used can be scattered over the programmable logic device and "chained" using general interconnect resources of the programmable logic device. Such an embodiment would not be faster, but would still provide an area advantage. Indeed, it would allow the use of single "orphan" look-up tables left over from implementing the remainder of the user logic design. Thus, if area savings are a greater concern than speed, multiplexers can be created according to the invention by interconnecting scattered look-up tables. This is particularly advantageous if a sufficient number of contiguous look-up tables to create the needed multiplexers could not be found without moving to a larger model of programmable logic device.

The present invention also provides a novel encoding scheme for the control inputs. Rather than using either binary encoding or "one-hot" encoding, the current invention preferably is implemented with a modified "one-hot" scheme where the number of control inputs exceeds the number of look-up tables by one. One of those inputs preferably is an input to the first look-up table in the chain, where another look-up table in the chain would receive as an input the output of a previous look-up table in the chain. In accordance with the encoding scheme of the invention, this input may assume either logic state. Of the remaining inputs, only one may be hot at any one time, as in the "one-hot" encoding scheme. Here again, while only one input may be in a logic state that is considered hot, that does not mean that only one input has a high signal voltage, or even that a high logic state is represented by a high signal voltage, or by the same signal voltage for all inputs, as long as the look-up table values are adjusted accordingly.

It will be appreciated that of the three encoding schemes described herein, the modified one-hot scheme of the present invention is less efficient in terms of the number of control inputs required as compared to the binary scheme, but is more efficient than the conventional one-hot scheme. This is because the "extra" input can be used as an "odd/even select" to allow each of the other control inputs to encode one of two possible outputs. Thus, one of the other inputs will select a particular one of the L look-up tables, meaning that one of that look-up table's two data inputs will be the output, and the odd/even select input determines which of those two data inputs is the output.

Therefore, in accordance with the present invention, there is provided a multiplexer circuit in a programmable logic device. The multiplier circuit has a circuit output and includes N data inputs (N≧6), C control inputs, and L look-up tables, each having only one table output. Preferably, L=0.5(N+MOD(N,2)) and C=L+1. Each of L−2 of the L look-up tables preferably has, as an input, a table output of another one of the L look-up tables, and has its table output directed only to an input of another one of the L look-up tables. Preferably, one of the L look-up tables other than the L−2 look-up tables has its table output directed only to an input of one of the L−2 look-up tables. Another one of the L look-up tables, other than the L−2 look-up tables and the one of the L look-up tables, has as an input the table output of one of the L−2 look-up tables, the output of the another one of the L look-up tables being the circuit output.

A method of encoding the control inputs of such a multiplexer circuit, and a programmable logic device incorporating such a multiplexer circuit, are also provided.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

As described above, the present invention provides multiplexers in programmable logic devices more efficiently than known implementations of multiplexers in cases of six or more inputs by chaining together the necessary number of look-up tables based on the number of inputs, rather than by constructing a tree of individual multiplexers each implemented by one or two look-up tables. Using four-input look-up tables as is preferred, two of the look-up table inputs are available for data (with a third used as a control input and fourth used to chain the output of a previous look-up table or, in the case of the first look-up table in the chain, as an additional control input), so that for an even number, N, of inputs, the number, L, of look-up tables is one-half the number of inputs, or L=0.5N. For an odd number, N, of inputs, L=0.5N+0.5=0.5(N+1). More generally, for any N, L=0.5(N+MOD(N,2)). A modified one-hot encoding scheme preferably is used as described above.

The invention will now be described with reference to FIGS. 1–6.

Figure 1:
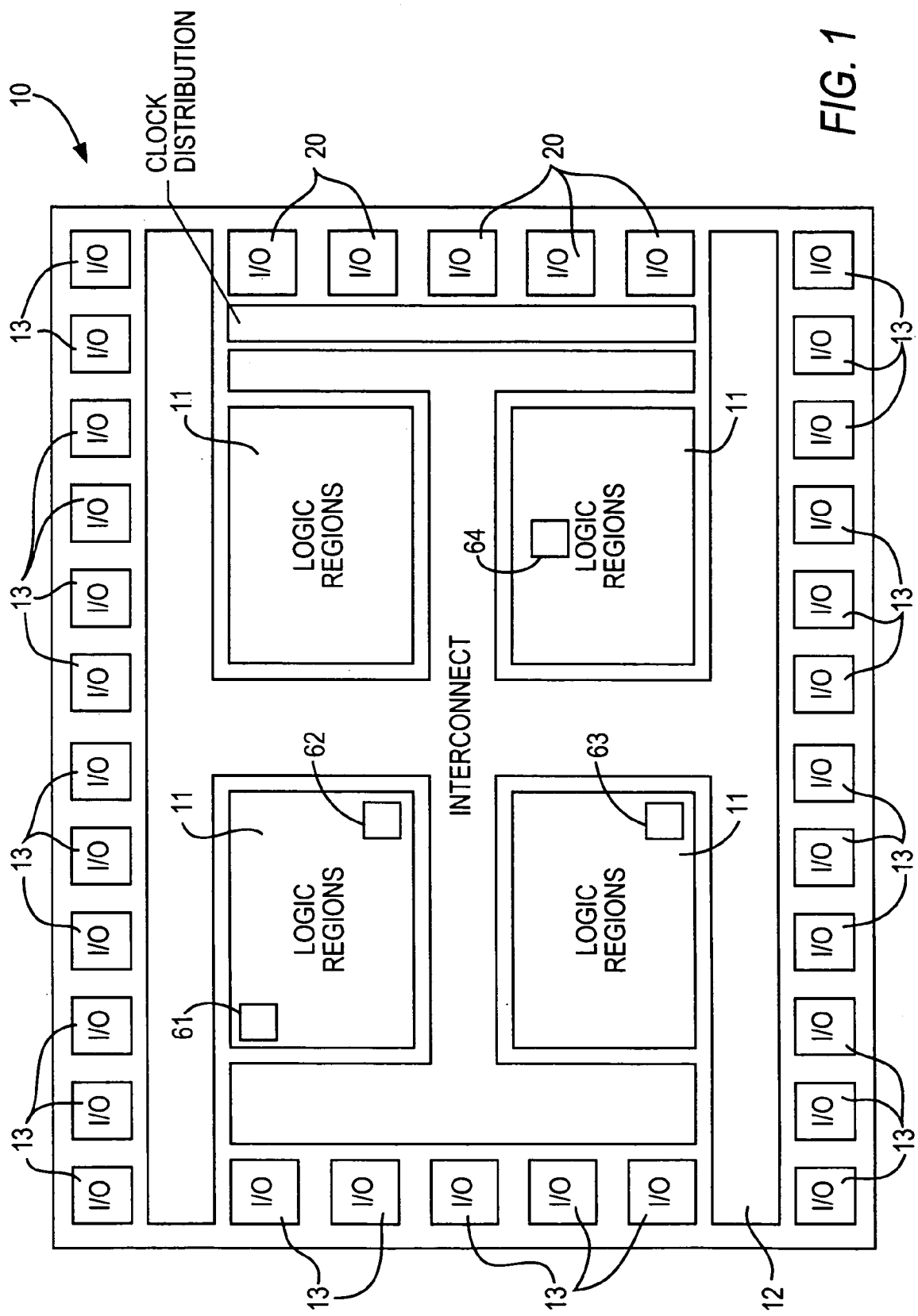
FIG. 1 is a schematic representation of a programmable logic device with which the present invention may be used.

PLD 10, shown schematically in FIG. 1, is one example of a device incorporating a serial interface 20 according to the invention. PLD 10 has a programmable logic core including programmable logic regions 11 accessible to programmable interconnect structure 12. The layout of regions 11 and interconnect structure 12 as shown in FIG. 1 is intended to be schematic only, as many actual arrangements are known to, or may be created by, those of ordinary skill in the art.

PLD 10 also includes a plurality of other input/output ("I/O") regions 13. I/O regions 13 preferably are programmable, allowing the selection of one of a number of possible I/O signaling schemes, which may include differential and/or non-differential signaling schemes. Alternatively, I/O regions 13 may be fixed, each allowing only a particular signaling scheme. In some embodiments, a number of different types of fixed I/O regions 13 may be provided, so that while an individual region 13 does not allow a selection of signaling schemes, nevertheless PLD 10 as a whole does allow such a selection.

Figure 2:
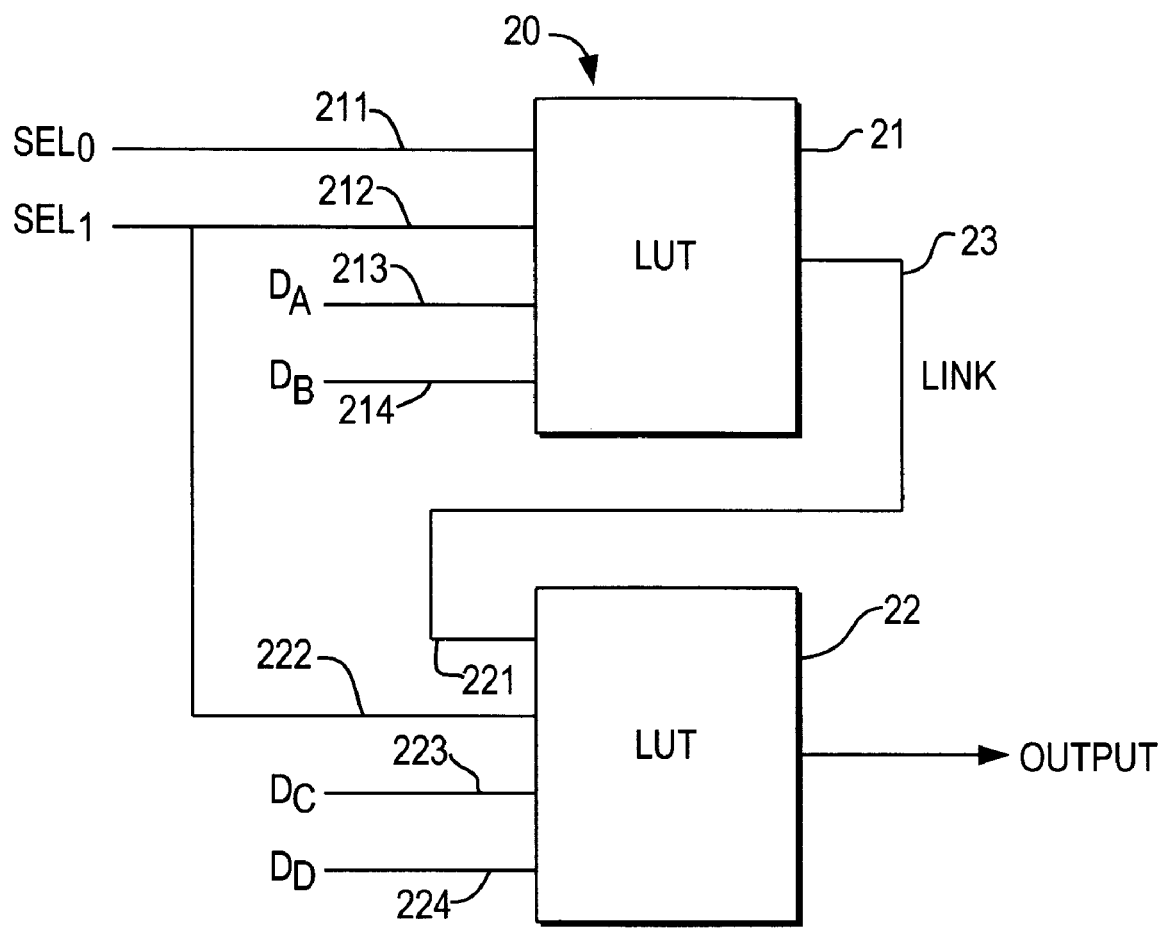
FIG. 2 is a schematic representation of a previously known four-to-one multiplexer configured from two look-up tables.

Programmable logic regions 11 preferably include a plurality of four-input look-up tables, the values of which may be loaded to implement any desired function of its four inputs, in order to implement a user logic design for device 10. FIG. 2 shows a previously known arrangement by which two such look-up tables 21, 22 can be connected to implement a four-to-one multiplexer 20. As can be seen, the four data inputs are divided between the last two inputs 213, 214 and 223, 224 of each multiplexer 21, 22 (although the particular order of the inputs is not important because the data loaded into each look-up table 21, 22 can be adjusted to obtain the desired output regardless of which input is used for which purpose). The first two inputs 211, 212 and 221, 222 of each multiplexer (again the particular order is not important) are used as select inputs. For look-up table 21, both select inputs come from outside multiplexer 20. For look-up table 22, only one select input comes from outside multiplexer 20 and is the same as one of the select inputs of look-up table 21. The other select input of look-up table 22 is the output of look-up table 21, chained to an input of look-up table 22 by link 23. For the circuit shown in FIG. 2, look-up table 21 is loaded as follows:

| $SEL_1$ | $SEL_2$ | LINK |
|---|---|---|
| 0 | 0 | $D_A$ |
| 0 | 1 | $D_B$ |
| 1 | 0 | 0 |
| 1 | 1 | 1 | while look-up table 22 is loaded as follows:

| $SEL_1$ | $SEL_2$ | OUTPUT |
|---|---|---|
| 0 | 0 | 0 |
| 0 | 1 | 1 |
| 1 | 0 | $D_C$ |
| 1 | 1 | $D_D$ |

Figure 3:
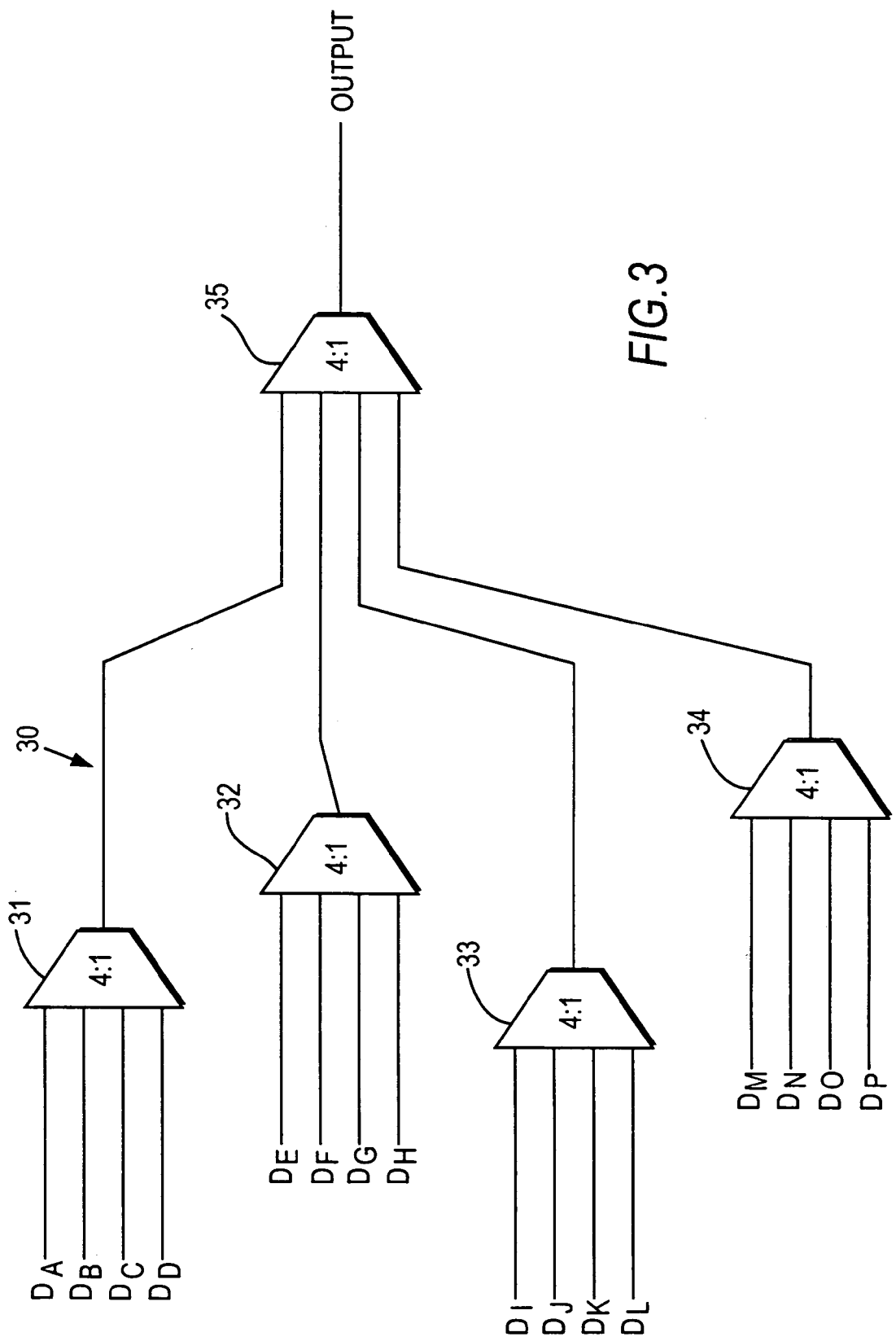
FIG. 3 is a schematic representation of a previously known 16-to-one multiplexer.
Figure 4:
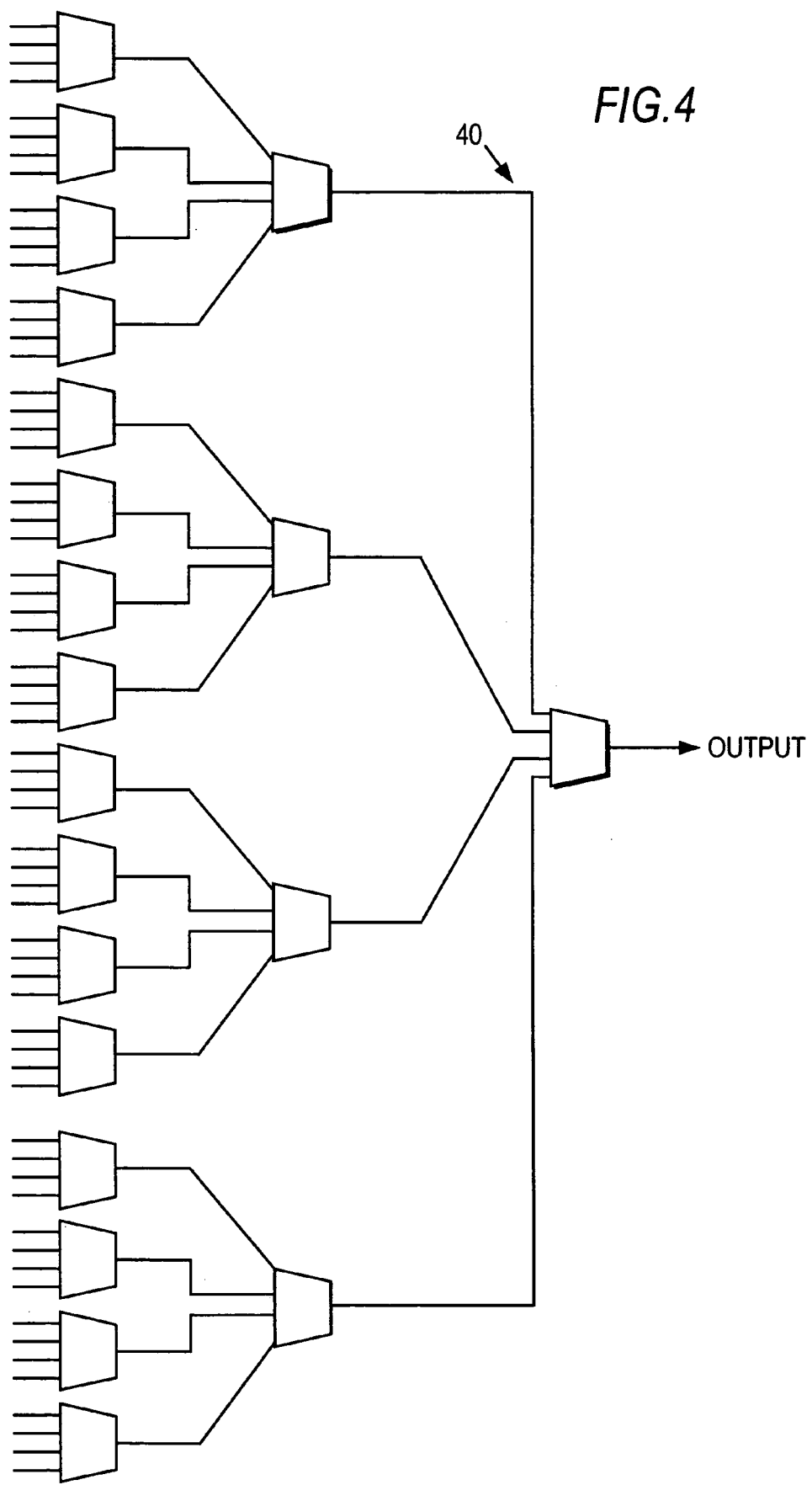
FIG. 4 is a schematic representation of a previously known 64-to-one multiplexer.

This known arrangement provides an N-to-one multiplexer (N=4) using L=2=0.5N look-up tables. However, for any greater N, this known arrangement is far less efficient. Consider, for example, a sixteen-to-one multiplexer 30, which would be implemented as shown in FIG. 3. Each of the sixteen inputs would be input to one of four-to-one multiplexers 31, 32, 33, 34 (two look-up tables each, for a total so far of eight look-up tables), while the outputs of all of those multiplexers would be input to four-to-one multiplexer 35 (two additional look-up tables, for a total of ten look-up tables). In this case, L=10 and N=16, so L=0.625N. Adding another level to the tree creates 64-to-one multiplexer 40 of FIG. 4, using 21 four-to-one multiplexers or 42 look-up tables. With N=64 and L=42, L=0.65625N. It will be readily seen that for N=256 (not shown), the number of four-to-one multiplexers is 21×4+1=85 or L=170, making L=0.6640625N, which approaches the theoretical ratio of 2N/3 for the most efficient case for large N, as described above.

Figure 5:
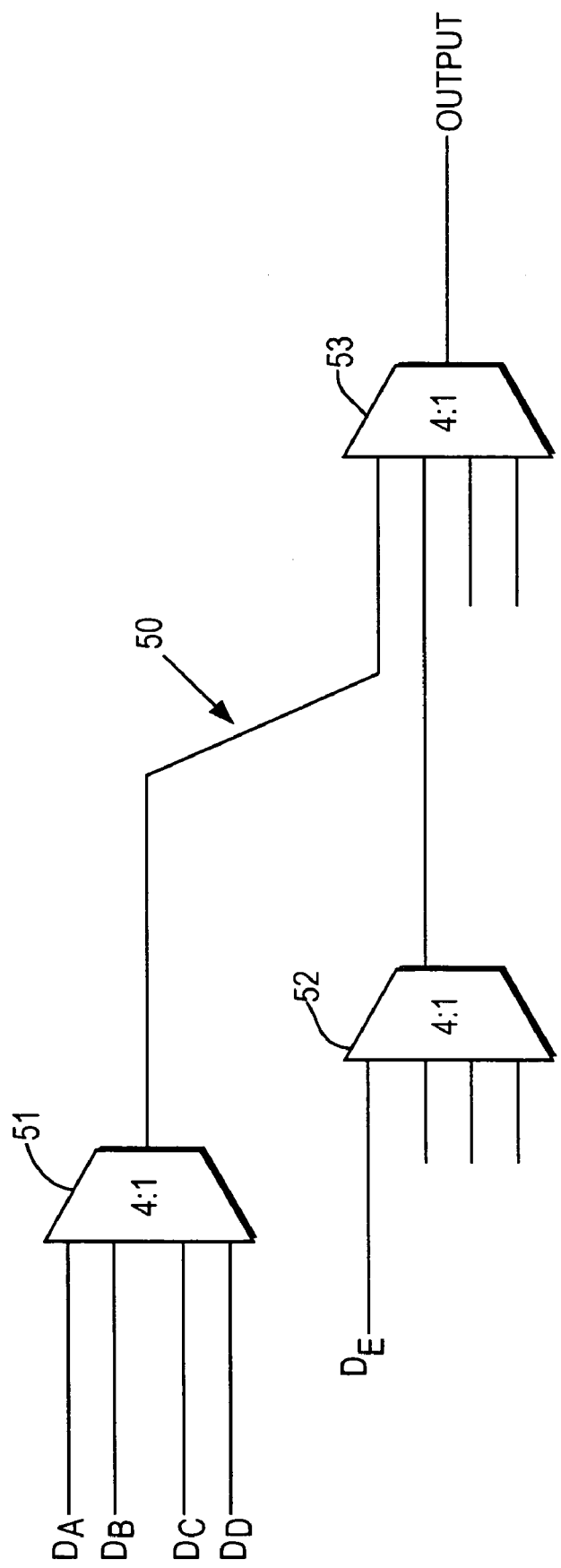
FIG. 5 is a schematic representation of a previously known five-to-one multiplexer.

For cases where N is not a multiple of 4, efficiency may be lower. As illustrated in FIG. 5 for N=5, to implement a five-to-one multiplexer 50 using the structure of FIG. 3 requires three four-to-one multiplexers 51, 52, 53 (six four-input look-up tables). In this case, N=5 and L=6 as described above, so L=1.2N. However, in fact the situation is somewhat less inefficient, because in this case, multiplexer 52 can be eliminated with input $D_E$ input directly to multiplexer 53. Moreover, multiplexer 53 can be a two-to-one multiplexer which can be implemented with one four-input look-up table. So for N=5, L=3=0.6N. It will also be seen that for N=6 or 7, multiplexer 53 can be a four-to-one multiplexer, so L=4. For N=6, then, L≈0.67N and for N=7, L≈0.57N. For N=8, two four-to-one multiplexers and one two-to-one multiplexer can be used, for L=5=0.625N as in the case of N=16.

This known arrangement can be generalized as follows: Starting with a four-to-one multiplexer, then you have N=4 and L=2. Adding another four-to-one multiplexer adds two look-up tables, takes up one input (to attach it to the existing tree) and provides four new inputs. So the net effect of adding a four-to-one multiplexer is to increase N by 3 and L by 2. Adding a two-to-one multiplexer adds one look-up table, takes up one input and adds one input, with the net effect of increasing each of N and L by 1. This can be expressed mathematically as follows:

$$L=2(INT((N-4)/3))+MOD((N-4),3)+2$$

The second term can only have the values 0, 1 or 2, and the third term is a constant, so for large N the first term dominates and tends to 2N/3 as expected. Indeed, the immediately foregoing equation is equivalent to:

$$L=CEIL(2(N-1)/3),$$

where CEIL(x) is a function that returns the next integer above x (i.e., x rounded up to the nearest integer unless x is already an integer) which more clearly tends to 2N/3.

According to either of the two immediately foregoing equations, the relationship of the number L of look-up tables to the number N of data inputs is as follows:

| Data inputs | Look-up tables |
|---|---|
| 4 | 2 |
| 5 | 3 |
| 6 | 4 |
| 7 | 4 |
| 8 | 5 |
| 9 | 6 |
| 10 | 6 |
| 11 | 7 |
| 12 | 8 |
| 13 | 8 |
| 14 | 9 |
| 15 | 10 |
| 16 | 10 |
| Some large value of N | 2N/3 |

Figure 6:
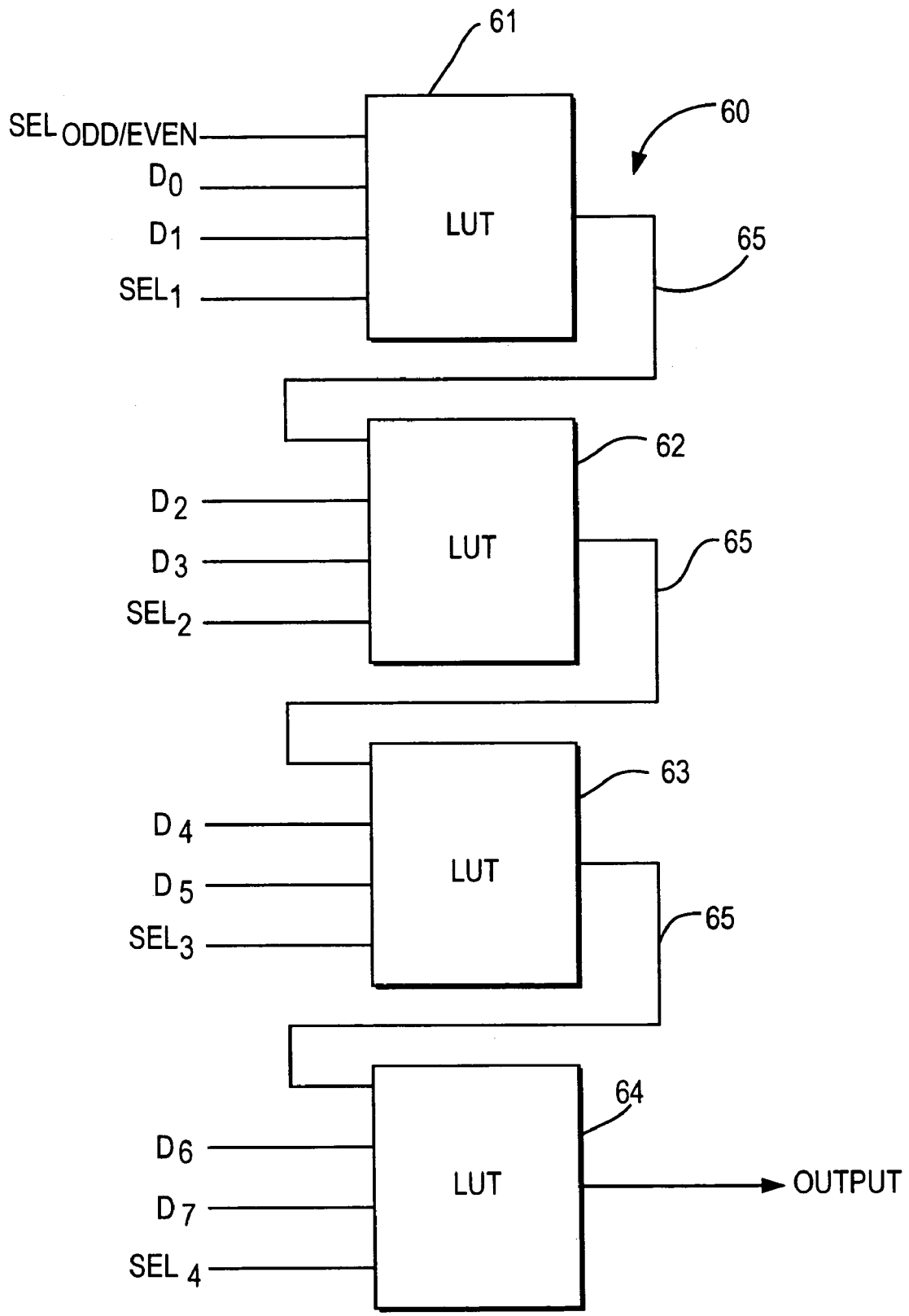
FIG. 6 is a schematic representation of a chain of look-up tables configured as a multiplexer in accordance with the present invention.

FIG. 6 shows an eight-to-one multiplexer 60 in accordance with the present invention, using four four-input look-up tables 61–64. Each look-up table 61–64 has two inputs used for data inputs $D_n$. One of the other two inputs is used as a control input $SEL_n$, while the fourth input is chained from the output of the previous one look-up tables 61–63 via links 65, except in the case of the look-up table 61, where the fourth input is an additional control input $SEL_{ODD/EVEN}$. With N=8 and L=4, L=0.5N, and the number of control inputs C=5=L+1. The encoding for multiplexer 60 preferably is as follows:

| $SEL_4$ | $SEL_3$ | $SEL_2$ | $SEL_1$ | $SEL_{ODD/EVEN}$ | OUTPUT |
|---|---|---|---|---|---|
| 0 | 0 | 0 | 1 | 0 | $D_0$ |
|   |   |   |   | 1 | $D_1$ |
| 0 | 0 | 1 | 0 | 0 | $D_2$ |
|   |   |   |   | 1 | $D_3$ |
| 0 | 1 | 0 | 0 | 0 | $D_4$ |
|   |   |   |   | 1 | $D_5$ |
| 1 | 0 | 0 | 0 | 0 | $D_6$ |
|   |   |   |   | 1 | $D_7$ |

It will be seen that for N=7, L is still 4=0.5N+0.5, and still C=L+1. It further will be seen that for any N, L=0.5 (N+MOD(N,2)) as set forth above, which for N≧6 is more efficient than (except that the case of N=7 is as efficient as) the previously known arrangement described above.

The immediately preceding table also illustrates the modified one-hot encoding described above, with only one of the $SEL_n$ control inputs hot at any one time, with the $SEL_{ODD/EVEN}$ control input assuming either state. Note that for odd N, the output will be undefined for one set of control input states. Although only one of the $SEL_n$ control inputs has been described as "hot," it will be appreciated that that does not mean that that input will be "high" in the sense of a positive voltage (e.g., +5V in a TTL system). Nor does it mean that only one signal will be TTL "high." Rather, the reference is to a logically hot signal. Thus, if $SEL_2$ were replaced by $nSEL_2$, the situation would be as follows:

| $SEL_4$ | $SEL_3$ | $nSEL_2$ | $SEL_1$ | $SEL_{ODD/EVEN}$ | OUTPUT |
|---|---|---|---|---|---|
| 0 | 0 | 1 | 1 | 0 | $D_0$ |
|   |   |   |   | 1 | $D_1$ |
| 0 | 0 | 0 | 0 | 0 | $D_2$ |
|   |   |   |   | 1 | $D_3$ |
| 0 | 1 | 1 | 0 | 0 | $D_4$ |
|   |   |   |   | 1 | $D_5$ |
| 1 | 0 | 1 | 0 | 0 | $D_6$ |
|   |   |   |   | 1 | $D_7$ | with no change in result. Although two of the $SEL_n$ inputs would be TTL "high," only one is considered "hot" within the meaning of this invention.

One look-up table configuration that could be used to create multiplexers 60 in accordance with the present invention is as follows:

| Inputs | | | | |
|---|---|---|---|---|
| D | C | B | A | Outputs |
| 0 | 0 | 0 | 0 | 0 |
| 0 | 0 | 0 | 1 | 1 |
| 0 | 0 | 1 | 0 | 0 |
| 0 | 0 | 1 | 1 | 1 |
| 0 | 1 | 0 | 0 | 0 |
| 0 | 1 | 0 | 1 | 1 |
| 0 | 1 | 1 | 0 | 0 |
| 0 | 1 | 1 | 1 | 1 |
| 1 | 0 | 0 | 0 | 0 |
| 1 | 0 | 0 | 1 | 0 |
| 1 | 0 | 1 | 0 | 1 |
| 1 | 0 | 1 | 1 | 0 |
| 1 | 1 | 0 | 0 | 0 |
| 1 | 1 | 0 | 1 | 1 |
| 1 | 1 | 1 | 0 | 1 |
| 1 | 1 | 1 | 1 | 1 |

However, it will be appreciated that that is only one example of look-up table programming that could be used. Moreover, it will be appreciated from the foregoing discussion that the order of inputs could be rearranged and inputs could be inverted, so that even this one example could give rise to many permutations. In addition, it will be appreciated that other numbers of look-up tables could be used to create other sizes of multiplexers.

As shown in FIG. 6, look-up tables 61–64 preferably are near one another. In addition, links 65 preferably are dedicated direct "fast links" provided between adjacent look-up tables. It will be appreciated however, that one or more of links 65 could be provided using the general purpose interconnect 12 of device 10. Moreover, it is not necessary for all of look-up tables 61–64 to be near one another. While the fastest possible result will be achieved when all of look-up tables 61–64 are near one another and connected by fast direct links, it is possible for look-up tables 61–64 to be near one another but interconnected by general purpose interconnect 12. It is also possible for look-up tables 61–64 to be scattered over device 10 as shown in FIG. 1, in which case the interconnections between look-up tables are clearly made in general purpose interconnect 12. Although the two latter arrangements are slower than the arrangement where all look-up tables are near one another and interconnected by direct connections, in some cases, depending upon the particular user application, the space advantage of being able to use available look-up tables, wherever on device 10 they may be located, is more important than speed. For example, the alternative to spreading the look-up tables over device 10 to create a multiplexer may be to use the next larger model of device 10 to make available a sufficient number of look-up tables near one another.

Figure 7:
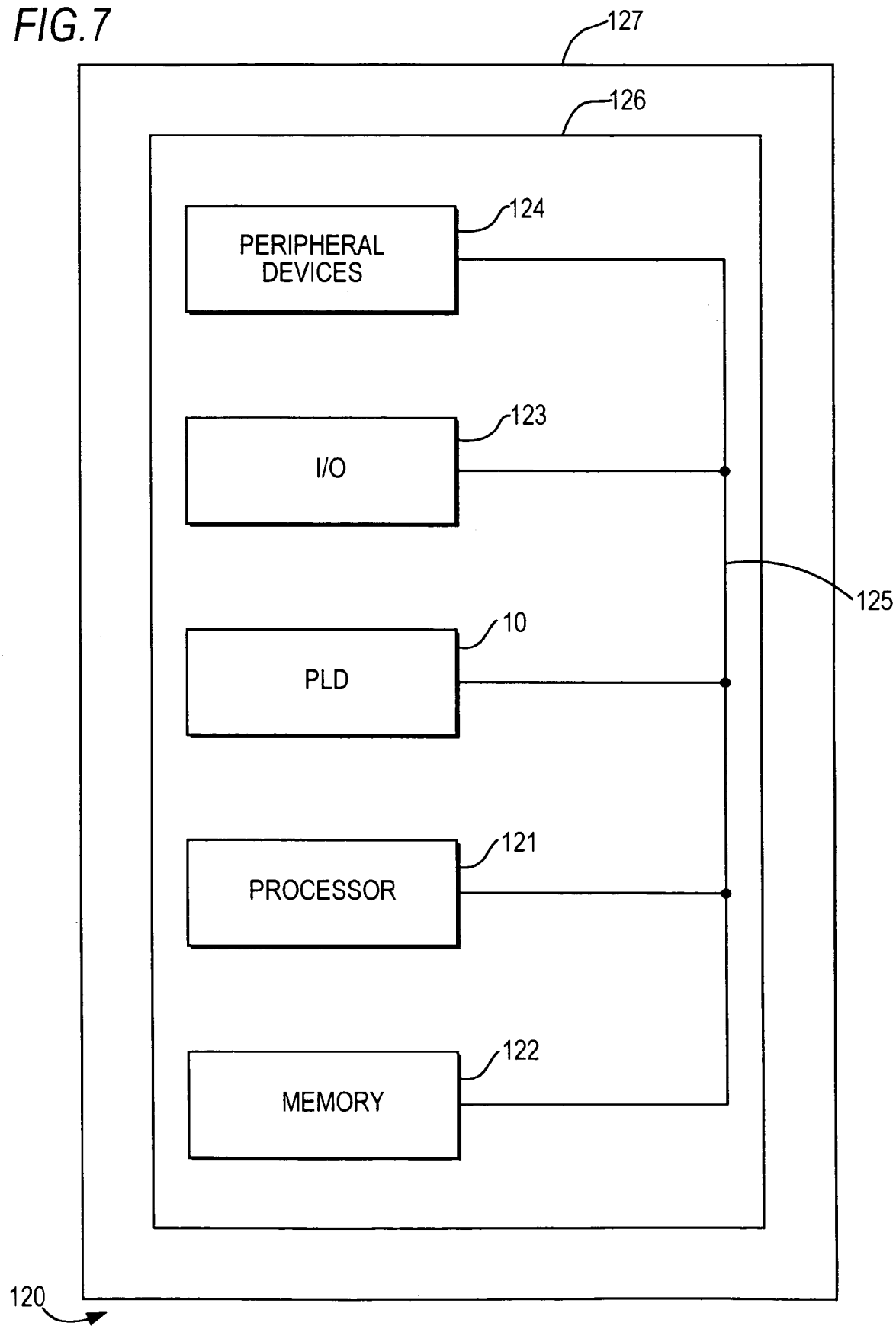
FIG. 7 is a schematic representation of a system including a programmable logic device incorporating a multiplexer according to the present invention.

A PLD 10 incorporating multiplexers 60 according to the present invention may be used in many kinds of electronic devices. One possible use is in a data processing system 120 shown in FIG. 7. Data processing system 120 may include one or more of the following components: a processor 121; memory 122; I/O circuitry 123; and peripheral devices 1244. These components are coupled together by a system bus 125 and are populated on a circuit board 126 which is contained in an end-user system 127.

System 120 can be used in a wide variety of applications, such as computer networking, data networking, instrumentation, video processing, digital signal processing, or any other application where the advantage of using programmable or reprogrammable logic is desirable. PLD 10 can be used to perform a variety of different logic functions. For example, PLD 10 can be configured as a processor or controller that works in cooperation with processor 121. PLD 10 may also be used as an arbiter for arbitrating access to a shared resources in system 120. In yet another example, PLD 10 can be configured as an interface between processor 121 and one of the other components in system 120. It should be noted that system 120 is only exemplary, and that the true scope and spirit of the invention should be indicated by the following claims.

Various technologies can be used to implement PLDs 10 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A multiplexer circuit in a programmable logic device, said multiplier circuit having a circuit output and comprising:

N data inputs, where N≧6;
C control inputs; and
L look-up tables, each having only one table output, wherein:
L=0.5(N+MOD(N,2));
C=L+1;
each of L–2 of said L look-up tables has, as an input, a table output of another one of said L look-up tables, and has its table output directed only to an input of another one of said L look-up tables;

one of said L look-up tables other than said L−2 look-up tables has its table output directed only to an input of one of said L−2 look-up tables; and another one of said L look-up tables, other than said L−2 look-up tables and said one of said L look-up tables, has as an input the table output of one of said L−2 look-up tables, the output of said another one of said L look-up tables being said circuit output.

2. The multiplexer circuit of claim 1 wherein each of said look-up tables has exactly four inputs.

3. The multiplexer circuit of claim 1 wherein:
at least some of said L look-up tables are adjacent one another; and
for at least some of said at least some of said L look-up tables, said table output is directed to an input of another of said at least some of said L look-up tables via a direct connection between said table output and said input of said another of said L look-up tables.

4. The multiplexer circuit of claim 3 wherein:
all of said L lookup tables are adjacent one another; and
for each of said L look-up tables other than said another one of said L look-up tables, said table output is directed to an input of another of said L look-up tables via a direct connection between said table output and said input of said another of said L look-up tables.

5. The multiplexer circuit of claim 1 wherein:
for at least some of said L look-up tables, said table output is directed to an input of another of said L look-up tables via a general interconnect resource of said programmable logic device.

6. The multiplexer circuit of claim 1 wherein:
each of said L look-up tables has as an input only one of said C control inputs, except for said one of said L look-up tables other than said L−2 look-up tables, which also has as an input an extra one of said C control inputs; and
at any one time, only one of said C control inputs is in a first logic state, with each other of said C control inputs in a second logic state different from said first logic state, except for said extra one of said C control inputs which may be in either said first logic state or said second logic state.

7. The multiplexer circuit of claim 6 wherein at least one of said C control inputs is electrically inverted, with data in said look-up tables adjusted accordingly.

8. The multiplexer circuit of claim 1 wherein each said look-up table has four inputs.

9. A programmable logic device comprising the multiplexer circuit of claim 1.

10. A digital processing system comprising:
processing circuitry;
a memory coupled to said processing circuitry; and
a programmable logic device as defined in claim 9 coupled to the processing circuitry and the memory.

11. A printed circuit board on which is mounted a programmable logic device as defined in claim 9.

12. The printed circuit board defined in claim 11 further comprising:
memory circuitry mounted on the printed circuit board and coupled to the programmable logic device.

13. The printed circuit board defined in claim 12 further comprising:
processing circuitry mounted on the printed circuit board and coupled to the memory circuitry.

14. An integrated circuit device comprising the multiplexer circuit of claim 1.

15. A digital processing system comprising:
processing circuitry;
a memory coupled to said processing circuitry; and
an integrated circuit device as defined in claim 14 coupled to the processing circuitry and the memory.

16. A printed circuit board on which is mounted an integrated circuit device as defined in claim 14.

17. The printed circuit board defined in claim 16 is further comprising:
memory circuitry mounted on the printed circuit board and coupled to the integrated circuit device.

18. The printed circuit board defined in claim 17 further comprising;
processing circuitry mounted on the printed circuit board and coupled to the memory circuitry.

19. A multiplexer circuit having a circuit output, N data inputs and C control inputs, and comprising L four-input loot-up tables, each having only one table output, wherein N≧6, L=0.5(N+MOD(N,2)) and C=L+1; said L look-up tables comprising:
a first look-up table having, as inputs, two of said N data inputs and two of said C control inputs, said only one table output of said first look-up table being connected as input to a second look-up table;
an Lth look-up table having, as inputs, two of said N data inputs, one of said C control inputs and said only one table output of an (L−1)th look-up table, said only one table output of said Lth look-up table being said circuit output; and
second through (L−1)th look-up tables, each having, as inputs, two of said N data inputs, one of said C control inputs and a table output of another of said L look-up tables, said only one table output of each of said second through (L−1)th look-up tables being an input to another of said L look-up tables.

20. The multiplexer circuit of claim 19 wherein:
at least some of said L look-up tables are adjacent one another; and
for at least some of said at least some of said L look-up tables, said table output is directed to an input of another of said at least some of said L look-up tables via a direct connection between said table output and said input of said another of said L look-up tables.

21. The multiplexer circuit of claim 20 wherein:
all of said L lookup tables are adjacent one another; and
for each of said first through (L−1)th look-up tables, said table output is directed to an input of another of said L look-up tables via a direct connection between said table output and said input of said another of said L look-up tables.

22. The multiplexer circuit of claim 19 wherein:
each of said L look-up tables has as an input only one of said C control inputs, except for said first look-up table, which also has as an input an extra one of said C control inputs; and
at any one time, only one of said C control inputs is in a first logic state, with each other of said C control inputs in a second logic state different from said first logic state, except for said extra one of said C control inputs which may be in either said first logic state or said second logic state.

23. The multiplexer circuit of claim 19 wherein at least one of said C control inputs is electrically inverted, with data in said look-up tables adjusted accordingly.

24. A programmable logic device comprising the multiplexer circuit of claim 19.

25. A digital processing system comprising:
processing circuitry;
a memory coupled to said processing circuitry; and
a programmable logic device as defined in claim 24 coupled to the processing circuitry and the memory.

26. A printed circuit board on which is mounted a programmable logic device as defined in claim 24.

27. The printed circuit board defined in claim 26 further comprising:
memory circuitry mounted on the printed circuit board and coupled to the programmable logic device.

28. The printed circuit board defined in claim 27 further comprising:
processing circuitry mounted on the printed circuit board and coupled to the memory circuitry.

29. An integrated circuit device comprising the multiplexer circuit of claim 19.

30. A digital processing system comprising:
processing circuitry;
a memory coupled to said processing circuitry; and
an integrated circuit device as defined in claim 29 coupled to the processing circuitry and the memory.

31. A printed circuit board on which is mounted an integrated circuit device as defined in claim 29.

32. The printed circuit board defined in claim 31 further comprising:
memory circuitry mounted on the printed circuit board and coupled to the integrated circuit device.

33. The printed circuit board defined in claim 32 further comprising:
processing circuitry mounted on the printed circuit board and coupled to the memory circuitry.

34. A multiplexer circuit comprising:
L look-up tables;
a plurality of data inputs, each of said data inputs being connected to one of said L look-up tables; and
C control inputs; wherein:
C=L+1;
each of said L look-up tables has as an input only one of said C control inputs, except for a first look-up table, which also has as an input an extra one of said C control inputs; and
at any one time, only one of said C control inputs is in a first logic state, with each other of said C control inputs in a second logic state different from said first logic state, except for said extra one of said C control inputs which may be in either said first logic state or said second logic state.

35. The multiplexer circuit of claim 34 wherein at least one of said C control inputs is electrically inverted, with data in said look-up tables adjusted accordingly.

36. A programmable logic device comprising the multiplexer circuit of claim 34.

37. A digital processing system comprising:
processing circuitry;
a memory coupled to said processing circuitry; and
a programmable logic device as defined in claim 36 coupled to the processing circuitry and the memory.

38. A printed circuit board on which is mounted a programmable logic device as defined in claim 36.

39. The printed circuit board defined in claim 38 further comprising:
memory circuitry mounted on the printed circuit board and coupled to the programmable logic device.

40. The printed circuit board defined in claim 39 further comprising;
processing circuitry mounted on the printed circuit board and coupled to the memory circuitry.

41. An integrated circuit device comprising the multiplexer circuit of claim 34.

42. A digital processing system comprising:
processing circuitry;
a memory coupled to said processing circuitry; and
an integrated circuit device as defined in claim 41 coupled to the processing circuitry and the memory.

43. A printed circuit board on which is mounted an integrated circuit device as defined in claim 41.

44. The printed circuit board defined in claim 43 further comprising:
memory circuitry mounted on the printed circuit board and coupled to the integrated circuit device.

45. The printed circuit board defined in claim 44 further comprising:
processing circuitry mounted on the printed circuit board and coupled to the memory circuitry.

46. A method for encoding control inputs of a multiplexer, said multiplexer comprising L interconnected look-up tables and having C said control inputs, said method comprising:
providing a respective one of said C control inputs to each of said L look-up tables;
providing another one of said C control inputs to only one of said L look-up tables, whereby C=L+1; and
at any one time, asserting only one of said C control inputs in a first logic state, with each other of said C control inputs in a second logic state different from said first logic state, except for said second one of said C control inputs which may be in either said first logic state or said second logic state.

47. The method of claim 46 wherein said asserting comprises, at said any one time:
inverting at least one of said C control inputs; and
adjusting data in said look-up tables accordingly.

* * * * *